(12) United States Patent
Rowell et al.

(10) Patent No.: US 10,809,290 B2
(45) Date of Patent: *Oct. 20, 2020

(54) RESONANT CAVITY FOR WIRELESS COMMUNICATION MEASUREMENT AND CORRESPONDING METHOD

(71) Applicant: Rohde & Schwarz GmbH & Co. KG, Munich (DE)

(72) Inventors: Corbett Rowell, Munich (DE); Vincent Abadie, Hohenschaeftlarn (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 178 days.

This patent is subject to a terminal disclaimer.

(21) Appl. No.: 16/049,966

(22) Filed: Jul. 31, 2018

(65) Prior Publication Data

US 2020/0041554 A1 Feb. 6, 2020

(51) Int. Cl.
*G01R 31/00* (2006.01)

(52) U.S. Cl.
CPC .................. *G01R 31/001* (2013.01)

(58) Field of Classification Search
CPC . H01L 2224/45099; H01L 2224/48227; H01L 2224/32145; H01L 2224/73265; H01L 2223/6677; H01L 2224/32013; H01L 2224/32225; H01L 2224/48106; H01L 2224/48233; H01L 2224/49176; H01L 2224/49177; H01L 23/552; H01L 23/66; H01L 25/0655; H01L 27/0688; H01L 29/165; H01L 25/50; H01L 27/0694; H01L 27/088; H01L 27/092; H01L 2924/19104; G01S 13/878; G01S 15/08; G01S 15/42; G01S 2013/468; G01S 7/484; G01S 7/486; G01S 7/497; G01S 7/5205; G01S 7/5208; G01S 1/02; G01S 13/70; G01S 17/02; G01S 17/08; G01S 7/40; G01S 7/28;

(Continued)

(56) References Cited

U.S. PATENT DOCUMENTS 6,223,033 B1 * 4/2001 Lusterman ............. H01Q 1/242
455/425
9,277,501 B2 3/2016 Lorenz et al.
(Continued)

OTHER PUBLICATIONS

Gardiol, "Higher-Order Modes in Dielectrically Loaded Rectangular Waveguides", IEEE Transactions on Microwave Theory and Techniques, vol. MTT-16, No. 11, Nov. 1968.

(Continued)

*Primary Examiner* — Nimesh Patel
(74) *Attorney, Agent, or Firm* — Potomac Technology Law, LLC

(57) ABSTRACT

A resonant cavity for wireless communication measurements with respect to a device under test is provided. In this context, the resonant cavity is hollow such that the device under test is held inside the resonant cavity, preferably without directly touching the walls. Furthermore, the internal dimension of the resonant cavity is of a size such that higher order modes are generated. In addition to this, the resonant cavity comprises at least one stepped cavity located on an outer portion of the resonant cavity holding the device under test. Further additionally, each of the at least one stepped cavity is resonant at a different frequency band.

19 Claims, 3 Drawing Sheets

(58) Field of Classification Search
CPC .......... H03F 1/223; H03F 1/32; H03F 1/3205; H03F 1/347; H03F 1/565; H03F 2200/294; H03F 2200/451; H03F 2200/534; H03F 3/195; H03F 3/245; H04L 12/2885; H04L 9/001; H04L 9/3278; H04L 27/2627; H04L 27/2649; H04L 27/2017; H04L 27/2601; H04L 27/008; H04L 5/0007; H04L 1/0003; H04L 27/2071; H04L 27/2602; H04L 63/0876; H04L 63/0861; H04L 63/107; H04L 5/0023; H04W 24/06; H04W 64/00; H04W 88/06; H04W 88/02; H04W 4/023; H04W 4/025; H04W 4/90; H04W 4/02; H04W 4/046; H04W 4/80; H04W 84/12; H04W 52/228; H04W 52/367; H04W 88/00; G01R 29/0871; G01R 27/28; G01R 31/002; G01R 31/3004; G01R 31/311; G01R 1/071; G01R 31/31917; G01R 31/3193; G01R 31/2815; G01R 31/2879; G01R 31/3008; G01R 31/31721; G01R 31/31924; G01R 31/2834; G01R 1/0408; G01R 31/2621; G01R 31/2851; G01R 31/2889; G01R 31/31813; G01R 31/386; G01R 31/02; G01R 31/2617; G01R 31/307; G01R 31/31915; G01R 31/001; G01R 29/0821; G01R 31/318307; H04B 17/104; H04B 3/14; H04B 1/69; H04B 1/707; H04B 1/1036; H04B 1/709; H04B 2201/70715; H04B 7/04; H04B 7/2628; H04B 7/0413; H04B 17/0085; H04B 17/10; H04B 17/20; H04B 17/29; H04B 17/391; H04B 17/14; H04B 17/12; H04B 17/13; H04B 17/16; H04B 1/38; H04B 10/11; H04B 17/327; H04B 3/466; H04J 3/14; A61B 5/0015; A61B 5/0022; A61B 5/01; A61B 5/14532; A61B 5/002; A61B 5/0077; A61B 5/7228; H04M 3/382; H04M 1/72533; H04M 7/006; H04M 2207/20; H04M 2242/04; H04M 2242/30; H04M 3/26; G08C 17/02; G08C 2201/92; G08C 2201/93; G01N 2291/02818; G01N 23/22; G01N 29/022; G01N 2291/014; G01N 2291/02827; G01N 29/036; G01N 29/4418; G01N 29/4436; G01N 29/4472; G01N 11/16; G01N 2203/0046; G01N 2291/042; G01N 29/12; G01N 29/222; G01N 9/002; G01N 9/36; G01N 29/0821; G01N 29/0871; G06F 11/263; G06F 11/2733; G06F 2209/482; G06F 9/4843; G06F 9/50; G06F 17/5009; G06F 11/273; G06F 11/2736; G01M 11/336; G01M 11/337; G01M 11/338; G01M 7/025; G01M 7/06; G01M 99/002; G01M 99/005; G01M 99/008; G01M 7/00; H01P 5/04; H01P 1/203; H01P 1/213; H01P 1/383; H01P 3/10; H01P 5/183; H01P 5/32; H01P 5/34; H01P 3/24; H01P 3/26; H01P 3/3042; H01Q 1/243; H01Q 5/328; H01Q 9/42; G05D 23/1393; G05D 1/0066; Y10T 307/76; Y10T 137/7761; Y10T 137/8225; Y10T 137/8242; Y10T 74/19405; G07C 3/005; G07C 3/14; H03J 7/042; H03J 7/22

See application file for complete search history.

(56) References Cited

U.S. PATENT DOCUMENTS

| | | | |
|---|---|---|---|
| 9,781,623 | B2 | 10/2017 | Seo et al. |
| 9,823,294 | B1* | 11/2017 | Aiello .................. G11C 29/021 |
| 2009/0303141 | A1* | 12/2009 | Kosdikian .......... G01R 29/0821 343/703 |
| 2010/0285753 | A1* | 11/2010 | Foegelle ............. H04B 17/3911 455/67.12 |
| 2011/0155725 | A1 | 6/2011 | Valenzuela et al. |
| 2012/0264377 | A1* | 10/2012 | Seelenfreund ........ H04W 24/06 455/67.11 |
| 2014/0295771 | A1* | 10/2014 | Finlow-Bates ....... H04W 24/06 455/67.14 |
| 2015/0153461 | A1* | 6/2015 | Aoki ...................... G01T 1/244 250/370.07 |
| 2016/0233970 | A1* | 8/2016 | Reed ..................... H04B 17/29 |
| 2017/0158359 | A1* | 6/2017 | Fetta ..................... B64G 1/409 |
| 2017/0223559 | A1* | 8/2017 | Kong ................... H04B 7/0413 |
| 2017/0310402 | A1* | 10/2017 | Wang ................... H04B 17/103 |

OTHER PUBLICATIONS

Tobar, et al., "Resonant Frequencies of Higher Order Modes in Cylindrical Anisotropic Dielectric Resonators", IEEE Transactions on Microwave Theory and Techniques, vol. 39, No. 12, Dec. 1991.
U.S. Department of Energy, "Higher Order Modes (HOMs)", SRF Hands-On Course at JLab, Newport News, VA, Jan. 19-30, 2015.

* cited by examiner

RESONANT CAVITY FOR WIRELESS COMMUNICATION MEASUREMENT AND CORRESPONDING METHOD

TECHNICAL FIELD

The invention relates to a resonant cavity, a corresponding wireless communication measurement cavity and a wireless communication measurement method.

BACKGROUND

Generally, in times of an increasing number of applications providing wireless communication capabilities, there is a growing need of a wireless communication measurement cavity and a corresponding method especially for verifying correct functioning of said applications with special respect to low-power performance measurements at multiple frequency bands, thereby allowing for testing in an uncomplex, and thus efficient, and cost-effective manner.

US 2011/0155725 A1 discloses a multimode resonant chamber with two or more cavities coupled in a complex way through a metallic plate with slots or waveguide. The multiple inputs and multiple outputs analyzer features several elements such as broadband antennas, metallic slotted plate, different types of lenses and different stirrers, both metallic and non-metallic. These elements, together with some procedures such as precise location of under-test elements out of the lower cavity allow for controlling the electromagnetic fields on its interior. As it can be seen, due to the elaborate coupling of the cavities of the chamber and the plurality of said additional elements, the usage of said resonant chamber disadvantageously leads to a limited efficiency, and thus also to increased cost.

Accordingly, there is a need to provide a resonant cavity, a corresponding wireless communication measurement cavity and a wireless communication measurement method, each of which ensures both a high efficiency and reduced costs.

SOME EXAMPLE EMBODIMENTS

Embodiments of the present invention advantageously address the foregoing requirements and needs, as well as others, by providing a resonant cavity, a corresponding wireless communication measurement cavity and a wireless communication measurement method, each of which ensures both a high efficiency and reduced costs.

According to a first aspect of the invention, a resonant cavity for wireless communication measurements with respect to a device under test is provided. In this context, the resonant cavity is hollow such that the device under test is held inside the resonant cavity without directly touching the walls. Furthermore, the internal dimension of the resonant cavity is of a size such that higher order modes are generated. In addition to this, the resonant cavity comprises at least one stepped cavity located on an outer portion of the resonant cavity holding the device under test. Further additionally, each of the at least one stepped cavity is resonant at a different frequency band. Advantageously, due to the reduced complexity of the resonant cavity, both a high efficiency and reduced costs can be ensured.

In this context, it is noted that the device under test may preferably be placed on a radio frequency neutral material, for instance foam, which does especially not absorb a lot of energy. Furthermore, the at least one stepped cavity may preferably be at least one box on top of the resonant cavity, wherein the design of the at least one stepped cavity especially determines the frequency band in which there is optimal operation when measuring.

According to a first preferred implementation form of said first aspect of the invention, the higher order modes create a mixed-mode electromagnetic field distribution. Advantageously, measurement efficiency can further be increased with special respect to multiple frequency bands.

According to a second preferred implementation form of said first aspect of the invention, each of the at least one stepped cavity comprises one or two orthogonal ports being connectable to measurement equipment. Additionally or alternatively, the resonant cavity comprises one or two ports, preferably orthogonal ports, being connectable to the measurement equipment. In this context, the respective port may preferably define the frequency band in which the measurement is made. Advantageously, measurements can be performed with respect to multiple frequency bands in an uncomplex and cost-effective manner.

According to a further preferred implementation form of said first aspect of the invention, each of the at least one stepped cavity is of smaller size than the resonant cavity. Advantageously, complexity of the resonant cavity is further reduced, thereby increasing efficiency.

According to a further preferred implementation form of said first aspect of the invention, each of the at least one stepped cavity is of a different size. Advantageously, resonance frequencies can easily be adjusted, thereby further reducing costs.

According to a further preferred implementation form of said first aspect of the invention, at least two of the at least one stepped cavity are arranged to form a stepped cavity module. In this context, at least two stepped cavity modules are located on the outer portion of the resonant cavity for multiple signal injection and/or capture for the purposes of multiple input multiple output. Advantageously, due to an interchangeability of the stepped cavity modules, measurement efficiency can further be increased.

According to a further preferred implementation form of said first aspect of the invention, the resonant cavity comprises insulating material being placed around the device under test to isolate at least a portion of the device under test from at least one wall of the resonant cavity. Advantageously, in this way, the location of a power measurement can be focused at certain portions, especially the non-isolated portions, of the device under test.

According to a further preferred implementation form of said first aspect of the invention, the resonant cavity is a base metal cavity. Advantageously, complexity and costs can further be reduced.

According to a further preferred implementation form of said first aspect of the invention, the size of each of the at least one stepped cavity gets smaller as the height of the resonant cavity increases. Advantageously, space can be saved, which leads to an increased efficiency.

According to a further preferred implementation form of said first aspect of the invention, at least one of the one or two orthogonal ports of each of the at least one stepped cavity comprises a preconfigured cutoff frequency. In addition to this or as an alternative, at least one of the one or two ports, preferably orthogonal ports, of the resonant cavity comprises a preconfigured cutoff frequency. Advantageously, the respective cutoff frequency can be adjusted in an efficient and cost-effective manner.

According to a further preferred implementation form of said first aspect of the invention, the resonant cavity is divided into at least two separate cavities.

According to a further preferred implementation form of said first aspect of the invention, at least one of the at least two separate cavities comprises the at least one stepped cavity. Advantageously, multiple input multiple output measurements can be performed in an accurate and efficient manner.

According to a further preferred implementation form of said first aspect of the invention, at least two of the at least one stepped cavity are arranged to form a stepped cavity module. In this context, at least one of the at least two separate cavities comprises at least one stepped cavity module. Advantageously, due to an interchangeability of the stepped cavity modules, measurement efficiency can further be increased.

According to a further preferred implementation form of said first aspect of the invention, the outer portion of the resonant cavity comprises the top or the bottom or a side wall of the resonant cavity. Advantageously, complexity can further be reduced, thereby increasing efficiency.

According to a second aspect of the invention, a wireless communication measurement method is provided. Said wireless communication measurement method comprises the steps of using a resonant cavity according to the first aspect of the invention or any of its preferred implementation forms, putting a device under test inside the resonant cavity, and performing a measurement with the aid of measurement equipment. Advantageously, due to the reduced complexity of the resonant cavity, both a high efficiency and reduced costs can be ensured.

According to a first preferred implementation form of said second aspect of the invention, the measurement comprises a low power measurement, preferably at least one of a power off, a spurious emissions, or a protocol testing measurement. Advantageously, measurement flexibility can be increased.

According to a second preferred implementation form of said second aspect of the invention, the measurement comprises a multiple input multiple output measurement, preferably at least one of a polarization multiple input multiple output, a spatial multiple input multiple output, or a frequency carrier aggregation measurement. Advantageously, the flexibility of the measurement can further be increased.

According to a further preferred implementation form of said second aspect of the invention, the measurement comprises a total radiated power or total isotropic sensitivity measurement, preferably a rough total radiated power or total isotropic sensitivity measurement. Advantageously, this allows for an initial assessment of the characteristics of the device under test in a fast and efficient manner.

Still other aspects, features, and advantages of the present invention are readily apparent from the following detailed description, simply by illustrating a number of particular embodiments and implementations, including the best mode contemplated for carrying out the present invention. The present invention is also capable of other and different embodiments, and its several details can be modified in various obvious respects, all without departing from the spirit and scope of the present invention. Accordingly, the drawing and description are to be regarded as illustrative in nature, and not as restrictive.

BRIEF DESCRIPTION OF THE DRAWINGS

Exemplary embodiments of the invention are now further explained with respect to the drawings by way of example only, and not for limitation. In the drawings.

DETAILED DESCRIPTION

A resonant cavity, a corresponding wireless communication measurement cavity and a wireless communication measurement method, each of which ensures both a high efficiency and reduced costs, are described. In the following description, for the purposes of explanation, numerous specific details are set forth in order to provide a thorough understanding of the invention. It is apparent, however, that the invention may be practiced without these specific details or with an equivalent arrangement. In other instances, well-known structures and devices are shown in block diagram form in order to avoid unnecessarily obscuring the invention.

Figure 1:
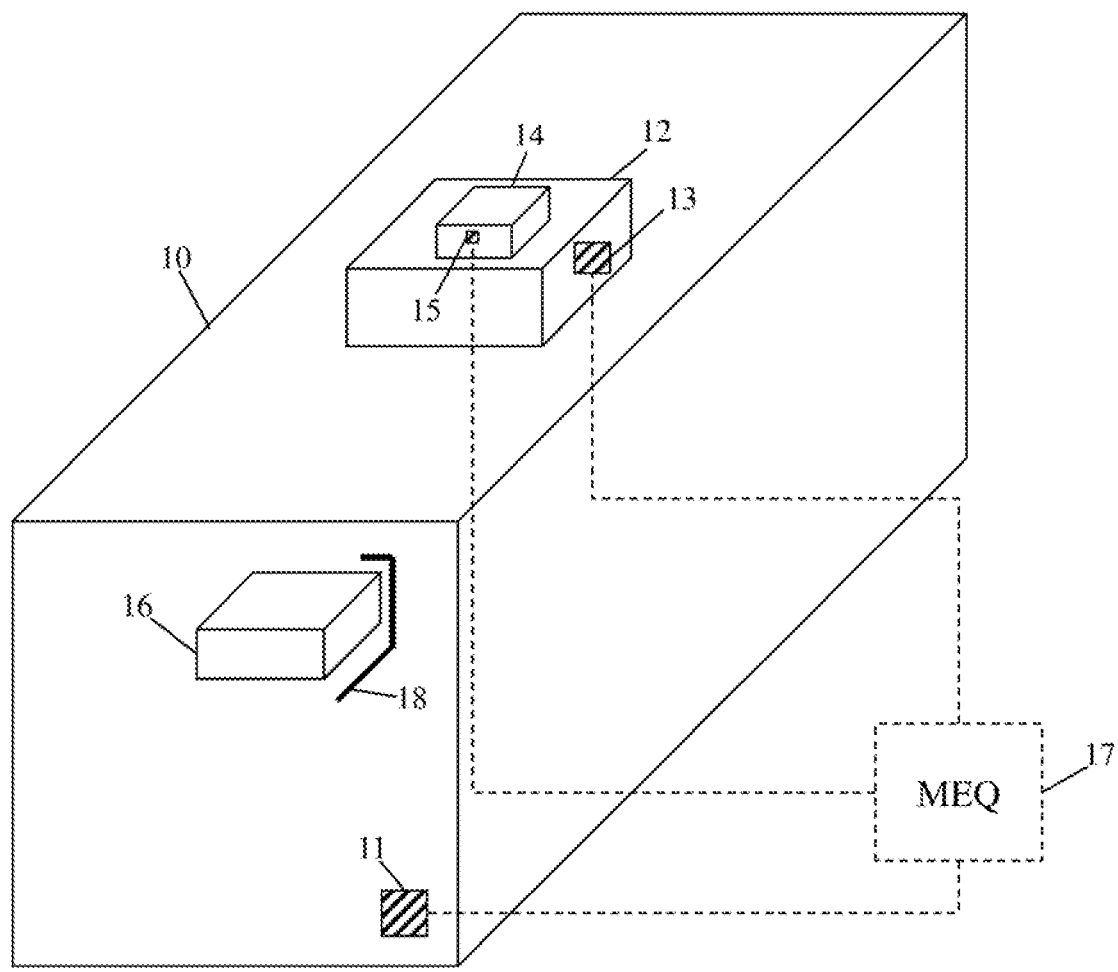
FIG. 1 shows a first exemplary embodiment of a resonant cavity according to the first aspect of the invention.

Firstly, FIG. 1 illustrates a first exemplary embodiment of the inventive resonant cavity 10. Said resonant cavity 10 for wireless communication measurements with respect to a device under test 16 is hollow such that the device under test 16 is held inside the resonant cavity 10 without directly touching the walls. Furthermore, the internal dimension of the resonant cavity 10 is of a size such that higher order modes are generated.

As it can be seen, the resonant cavity 10 comprises at least one stepped cavity, exemplarily two stepped cavities 12, 14, located on an outer portion of the resonant cavity 10 holding the device under test 16. In this context, each of the two stepped cavities 12, 14 is resonant at a different frequency band. In this context, said outer portion of the resonant cavity 10 exemplarily is top of the resonant cavity 10. Alternatively, the outer portion may comprise the bottom or a side wall of the resonant cavity 10.

In addition to this, it is noted that the higher order modes preferably create a mixed-mode electromagnetic field distribution. In other words, higher frequencies are preferably mixed.

Moreover, each of the two stepped cavities 12, 14 comprises one or two orthogonal ports 13, 15 being connectable to measurement equipment 17. Additionally, the resonant cavity 10 comprises one or two ports, exemplarily orthogonal ports 11, being also connectable to the measurement equipment 17.

In this context, it might be particularly advantageous if at least one of the one or two orthogonal ports 13, 15 comprises a preconfigured cutoff frequency. In addition to this or as an alternative, at least one of the one or two ports, exemplarily orthogonal ports 11, of the resonant cavity 10 may especially comprise a preconfigured cutoff frequency.

According to FIG. 1, it is noted that each of the two stepped cavities 12, 14 is of smaller size than the resonant cavity 10, wherein each of the said two stepped cavities 12, 14 is of a different size. In addition to this, the size of each of the two stepped cavities 12, 14 gets smaller as the height of the resonant cavity 10 increases.

Furthermore, the two stepped cavities 12, 14 are arranged to form a stepped cavity module. In this context, it might be particularly advantageous if at least two stepped cavity modules are located on the outer portion of the resonant cavity 10 for multiple signal injection and/or capture for the purposes of multiple input multiple output.

In addition to this, each or at least one of said stepped cavity modules may preferably be configured to measure at least one of one polarization component, two polarization components, or one spatial component. Each of said stepped cavity modules may especially be configured to measure a certain frequency band. Additionally, it might be particularly advantageous if the resonant cavity 10 comprises 4, 6, or 8 stepped cavity modules.

As it can further be seen from FIG. 1, the resonant cavity 10 additionally comprises insulating material 18 being placeable around the device under test 16 to isolate at least a portion of the device under test 16 from at least one wall of the resonant cavity 10.

With respect to the resonant cavity 10, it is noted that the resonant cavity 10 may especially be a base metal cavity.

Figure 2:
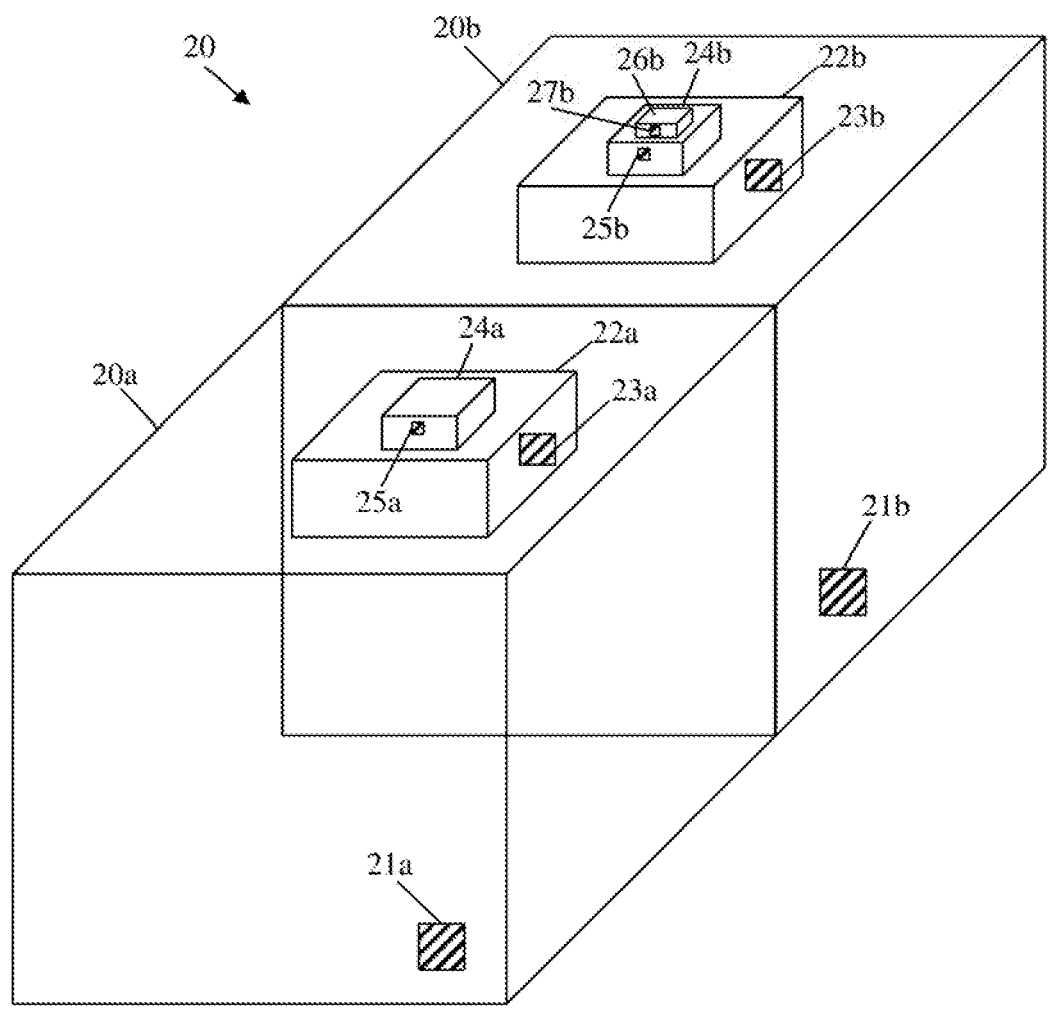
FIG. 2 shows a second exemplary embodiment of the inventive resonant cavity.

Now, with respect to FIG. 2, a second exemplary embodiment of a resonant cavity 20 according to the first aspect of the invention is depicted. In this exemplary case, the resonant cavity 20 is divided into two separate cavities, especially a first separate cavity 20a and a second separate cavity 20b.

In this context, at least one, exemplarily each, of the two separate cavities 20a, 20b comprises at least one stepped cavity, exemplarily the stepped cavities 22a, 24a, 22b, 24b, 26b.

Whereas the two stepped cavities 22a, 24a are arranged to form a first stepped cavity module, the three stepped cavities 22b, 24b, 26b are arranged to form a second stepped cavity module. In this context, at least one, exemplarily each, of the two separate cavities 20a, 20b comprises the respective one of the first and the second stepped cavity module.

It is noted that the above explanations with respect to the first exemplary embodiment 10 of the inventive resonant cavity according to FIG. 1 analogously apply to the second exemplary embodiment 20 of FIG. 2. In this context, at least one of the first separate cavity 20a and the second separate cavity 20b may especially be seen as the resonant cavity 10.

Furthermore, each of the two stepped cavities 22a, 24a comprises one or two orthogonal ports 23a, 25a being connectable to measurement equipment such as the measurement equipment 17 according to FIG. 1, whereas each of the three stepped cavities 22b, 24b, 26b comprises one or two orthogonal ports 23b, 25b, 27b being connectable to the measurement equipment. Additionally, the first separate cavity 20a comprises one or two ports, exemplarily orthogonal ports 21a, being also connectable to the measurement equipment, whereas the second separate cavity 20b comprises one or two ports, exemplarily orthogonal ports 21b, being likewise connectable to said measurement equipment.

Additionally, it might be particularly advantageous if at least one of the one or two orthogonal ports 23a, 25a, 23b, 25b, 27b comprises a preconfigured cutoff frequency. In addition to this or as an alternative, at least one of the one or two ports, exemplarily orthogonal ports 21a, 21b, of the respective one of the first and the second separate cavity 20a, 20b may especially comprise a preconfigured cutoff frequency.

Figure 3:
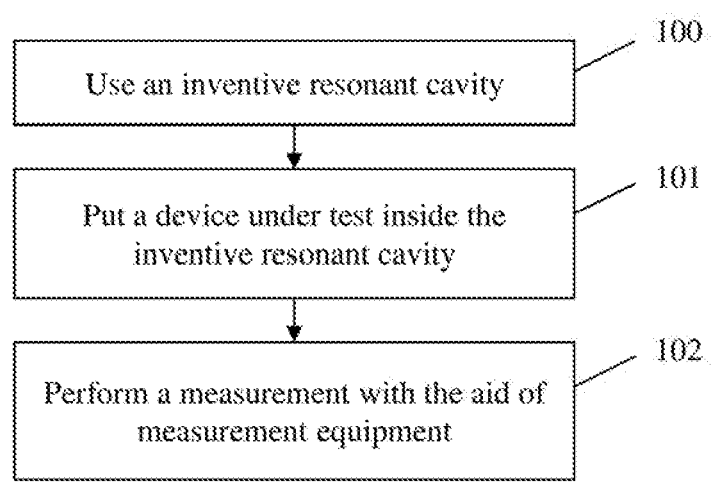
FIG. 3 shows a flow chart of an exemplary a wireless communication measurement method according to the second aspect of the invention.

Finally, FIG. 3 shows a flow chart of an exemplary embodiment of the inventive wireless communication measurement method. In a first step 100, an inventive resonant cavity is used. Then, in a second step 101, a device under test is put inside the inventive resonant cavity. In addition to this, in a third step 102, a measurement is performed with the aid of measurement equipment.

In this context, it might be particularly advantageous if the measurement comprises a low power measurement, preferably at least one of a power off, a spurious emissions, or a protocol testing measurement.

In addition to this or as an alternative, the measurement may especially comprise a multiple input multiple output measurement, preferably at least one of a polarization multiple input multiple output, a spatial multiple input multiple output, or a frequency carrier aggregation measurement.

Further additionally or alternatively, the measurement may especially comprise a total radiated power or total isotropic sensitivity measurement, preferably a rough total radiated power or total isotropic sensitivity measurement.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. A resonant cavity for wireless communication measurements with respect to a device under test, comprising:
    the resonant cavity, which comprises at least one stepped cavity located on an outer portion of the resonant cavity holding the device under test;
    wherein the resonant cavity is hollow such that the device under test is held inside the resonant cavity;
    wherein the internal dimension of the resonant cavity is of a size such that higher order modes are generated;
    wherein each of the at least one stepped cavity is resonant at a different frequency band; and
    wherein the communications measurements comprise a total radiated power, total isotropic sensitivity, rough total radiated power, or total isotropic sensitivity measurement.

2. The resonant cavity according to claim 1, wherein the higher order modes create a mixed-mode electromagnetic field distribution.

3. The resonant cavity according to claim 1, wherein each of the at least one stepped cavity comprises one or two orthogonal ports being connectable to measurement equipment, and/or wherein the resonant cavity comprises one or two orthogonal ports, being connectable to the measurement equipment.

4. The resonant cavity according to claim 1, wherein each of the at least one stepped cavity is of smaller size than the resonant cavity.

5. The resonant cavity according to claim 1, wherein each of the at least one stepped cavity is of a different size.

6. The resonant cavity according to claim 1, wherein at least two of the at least one stepped cavity are arranged to form a stepped cavity module, and wherein at least two stepped cavity modules are located on the outer portion of the resonant cavity for multiple signal injection and/or capture for the purposes of multiple input multiple output.

7. The resonant cavity according to claim 1, wherein the resonant cavity comprises insulating material around the device under test to isolate at least a portion of the device under test from at least one wall of the resonant cavity.

8. The resonant cavity according to claim 1, wherein the resonant cavity is a base metal cavity.

9. The resonant cavity according to claim 1, wherein the size of each of the at least one stepped cavity gets smaller as the height of the resonant cavity increases.

10. The resonant cavity according to claim 3, wherein at least one of the one or two orthogonal ports of each of the at least one stepped cavity comprises a preconfigured cutoff frequency, and/or wherein at least one of the one or two orthogonal ports of the resonant cavity comprises a preconfigured cutoff frequency.

11. The resonant cavity according to claim 1, wherein the resonant cavity is divided into at least two separate cavities.

12. The resonant cavity according to claim 11, wherein at least one of the at least two separate cavities comprises the at least one stepped cavity.

13. The resonant cavity according to claim 11, wherein at least two of the at least one stepped cavity are arranged to form a stepped cavity module, and wherein at least one of the at least two separate cavities comprises at least one stepped cavity module.

14. The resonant cavity according to claim 1, wherein the outer portion of the resonant cavity comprises the top or the bottom or a side wall of the resonant cavity.

15. The resonant cavity according to claim 1, wherein the device under test is held inside the resonant cavity without directly touching the walls.

16. A wireless communication measurement method comprising the steps of:

performing a measurement of a device under test within a resonant cavity with the aid of measurement equipment, wherein the measurement comprises a total radiated power, total isotropic sensitivity, rough total radiated power, or total isotropic sensitivity measurement; and wherein the resonant cavity comprises at least one stepped cavity located on an outer portion of the resonant cavity holding the device under test, wherein the resonant cavity is hollow such that the device under test is held inside the resonant cavity, wherein the internal dimension of the resonant cavity is of a size such that higher order modes are generated, and wherein each of the at least one stepped cavity is resonant at a different frequency band.

17. The wireless communication measurement method according to claim 16, wherein the measurement comprises a low power measurement, which comprises at least one of a power off, a spurious emissions, and a protocol testing measurement.

18. The wireless communication measurement method according to claim 16, wherein the measurement comprises a multiple input multiple output measurement, which comprises at least one of a polarization multiple input multiple output, a spatial multiple input multiple output, or a frequency carrier aggregation measurement.

19. The wireless communication measurement method according to claim 16, wherein the device under test is held inside the resonant cavity without directly touching the walls.

* * * * *